United States Patent [19]

Mochizuki et al.

[11] Patent Number: 4,884,120

[45] Date of Patent: Nov. 28, 1989

[54] SEMICONDUCTOR DEVICE AND METHOD FOR MAKING THE SAME

[75] Inventors: Hiroshi Mochizuki; Reiji Tamaki; Junichi Arima; Masaaki Ikegami; Eisuke Tanaka; Kenji Saito, all of Hyogo, Japan

[73] Assignee: Mitsubishi Denki Kabushiki Kaisha, Tokyo, Japan

[21] Appl. No.: 16,787

[22] Filed: Feb. 20, 1987

[30] Foreign Application Priority Data

Feb. 20, 1986 [JP] Japan .................................. 61-37785

[51] Int. Cl.$^4$ ..................... H01L 23/48; H01L 29/44; H01L 29/54; H01L 29/62
[52] U.S. Cl. ........................................ 357/68; 357/65; 357/71
[58] Field of Search ........................ 357/71, 68, 65, 67

[56] References Cited

U.S. PATENT DOCUMENTS

| | | | |
|---|---|---|---|
| 3,866,311 | 2/1975 | Salles et al. | 29/578 |
| 4,698,125 | 10/1987 | Rhodes | 357/71 X |
| 4,707,457 | 11/1987 | Erb | 357/71 |
| 4,734,754 | 3/1988 | Nikawa | 357/71 R |

FOREIGN PATENT DOCUMENTS

| | | |
|---|---|---|
| 0216017 | 4/1987 | European Pat. Off. |
| 3109801 | 9/1982 | Fed. Rep. of Germany . |
| 60-04258 | 1/1985 | Japan .................................. 357/71 |
| 61-280638 | 12/1986 | Japan . |
| 2128025 | 4/1984 | United Kingdom .................. 357/71 |

OTHER PUBLICATIONS

"Patents Abstracts of Japan", vol. 10, no. 54 (mar. 4, 1986).
Cadien and Losee, "A Method for Eliminating Hillocks in Integrated-Circuit Metallizations", *J. Vac. Sci. Tecnol.* B2(1), (jan.-Mar. 1984) pp. 82-83.
D. Culver et al., "Modeling of Metal Step Coverage for Minimum Feature Size Contacts and Vias", IEEE 1985 V-MIC Conference CH 219-2185/0000-03994, 01.00, pp. 399-407.

Primary Examiner—Andrew J. James
Assistant Examiner—Sara W. Crane
Attorney, Agent, or Firm—Lowe, Price, Leblanc, Becker & Shur

[57] ABSTRACT

An improved interconnection structure and method for forming the interconnection in a semiconductor device having multilayered interconnection structure in which a contact hole for electrically connecting a first layer interconnection to a predetermined region of a semiconductor substrate and a through hole for electrically connecting a second layer interconnection to the first layer interconnection are formed in the regions overlapping with each other in planer layout. In the interconnection structure of the present invention, hillocks effective to compensate for the contact hole step are formed in the first layer interconnection only in the region of the contact hole of the first layer interconnection. In the method for forming the interconnection according to the present invention, a first layer interconnection is formed and a chemical conversion process is selectively performed to form a film which is more rigid than the first layer interconnection film on a predetermined region of the first layer interconnection film, and then a heat process is performed to generate hillocks only at the region of the contact hole of the first layer interconnection film. The second layer interconnection film is formed thereafter.

4 Claims, 2 Drawing Sheets

SEMICONDUCTOR DEVICE AND METHOD FOR MAKING THE SAME

BACKGROUND OF THE INVENTION

1. Field of the Invention

The present invention relates to a semiconductor device and the method for making the same. More specifically, the present invention relates to a interconnection structure and the method for making the same for improving electrical contact between the interconnection of a first layer and the interconnection of a second layer in a semiconductor device having multilayer interconnection structure in which a contact hole for the electrical contact between the interconnection of the first layer and the surface of the semiconductor substrate and a through hole for the electrical contact between the interconnection of the first layer and the interconnection of the second layer are formed in the same region in order to improve the degree of integration.

2. Description of the Prior Art

Recently, with the advancement of the degree of integration in a semiconductor device, the number of elements formed thereon are increase and, correspondingly, the number of interconnections are also increased to present an obstacle to the improvement in the degree of integration. In order to solve this problem, a method had been proposed in which the interconnection is formed in a multilayered structure and the contact region of the interconnection of the first layer and the semiconductor substrate and the contact region of the interconnection of the first layer and the interconnection of the overlying second layer are formed in the same region in order to decrease the area of the interconnection regions.

FIGS. 1A and 1B are cross-sectional side views schematically showing the steps of manufacturing the above described multilayered interconnection of a semiconductor device. The method for manufacturing the conventional interconnection in a semiconductor device will be hereinafter described with reference to FIGS. 1A and 1B.

To start with, description will be made with reference to FIG. 1A. An insulating film such as PSG film (phosphorous doped silicon oxide film) is formed by e.g. CVD method (chemical vapor deposition) on the entire surface of a silicon semiconductor substrate (hereinafter simply referred to as a silicon substrate) on which circuit elements etc. (not shown) are formed. Then a resist film (not shown) is applied on the entire surface of the insulating film 2, and then it is exposed and etched to be patterned into a predetermined form. A penetrating hole (hereinafter referred to as a contact hole) 10 deep enough to reach the surface of the silicon substrate 1 is formed in a predetermined region of the insulating film 2 by dry etching or wet etching using the patterned resist film (not shown) as a mask. After removing the resist film used as a mask, an aluminum film is deposited to cover the insulating film 2 and the contact hole 10 by sputtering method or the like. This aluminum film is patterned by dry etching or wet etching using a resist film (not shown) as a mask to form a first layer aluminum interconnection film 3 having a predetermined form. Then an interlayer insulating film 5 is formed over the entire exposed surface by using the CVD method. A silicon nitride film, silicon oxide film or the like may be used as the interlayer insulating film 5. A patterned resist film (not shown) is formed on the interlayer insulating film 5. Then a penetrating hole (hereinafter simply referred to as a through hole) 11 reaching the surface of the first layer aluminum interconnection film 3 is formed in a predetermined region of the interlayer insulating film 5 by dry etching or wet etching, using the patterned resist film as a mask. The through hole 11 is formed such that it overlaps with the contact hole 10 in planar layout. The through hole becomes a contact hole for making electrical contact between the first layer aluminum interconnection 3 and the second layer aluminum interconnection which in turn will be formed in the following steps.

Let us turn to FIG. 1B. An aluminum film to be the second layer interconnection film will be formed on the entire exposed surface by the sputtering method or the like. This aluminum film is patterned by dry etching or wet etching into a predetermined shape to form the second layer aluminum interconnection film 6 for electrically connecting the first layer aluminum inerconnection film 3 with other circuit elements. As shown in FIG. 1B, since the contact hole 10 and the through hole 11 are formed in the same region, the effective aspect ratio of the through hole (the ratio of the depth to the width of the through hole 11) becomes large, so that the step coverage at the through hole 11 with the second layer aluminum interconnection film 6 is not satisfactory.

In a conventional semiconductor device having multilayered interconnection structure formed in the above described manner, since the contact hole in the underlying insulating film and the through hole in the interlayer insulating film are formed in the same region, the step of the underlying insulating film is added to the step of the interlayer insulating film, enlarging the effective aspect ratio of the through hole formed in the interlayer insulating film. Thus, the step coverage of the second layer aluminum interconnection film at the through hole 11 is deteriorated as shown in FIG. 1B. Consequently, it becomes difficult to make full electrical contact of the first layer aluminum interconnection film 3 with the second layer aluminum interconnection film 6, causing a problem that poor electrical contact between the first layer aluminum interconnection 3 and the second layer aluminum interconnection 6 occurs.

On the other hand, when the interlayer insulating film 5 is made thin to minimize the effective aspect ratio of the through hole 11 at the interlayer insulating film 5 in order to prevent the above described problem, the interlayer insulating film 5 can not fully effect its function, causing another problem that sufficient electrical insulation can not be kept between the second layer aluminum interconnection film 6 and the underlying first layer aluminum interconnection film or the silicon substrate 1.

Therefore, in order to solve the above described problems, in a conventional semiconductor device having multilayered interconnection structure and therefore in the method of making the same, it is necessary to form the contact hole for the first layer aluminum interconnection and the through hole for the second layer aluminum interconnection in different regions so that they may not overlap with each other. This has been a big obstacle to the improvement in degree of integration of a semiconductor device having multilayered interconnection structure.

The metal step coverage at the contact hole and the through hole is discussed in D. Culver et al., "MODELING OF METAL STEP COVERAGE FOR MINIMUM FEATURE SIZE CONTACTS AND VIAS", IEEE 1985 V-MIC Conference CH2197-2185/0000-0399$ 01.00, pp. 399–407. This reference shows that a dominant parameter in the process variables having influence to the metal step coverage is the via and contact sidewall slope.

SUMMARY OF THE INVENTION

An object of the present invention is to provide a semiconductor device and the method for making the same for eliminating the above described drawbacks of a conventional semiconductor device wherein the excellent electrical contact can be readily and surely made between the first layer interconnection and the second layer interconnection even in the case where the through hole for the second layer interconnection is provided directly above the contact hole portion for the first layer interconnection.

In the semiconductor device according to the present invention, hillocks are concentratedly formed on the first layer interconnection film which is formed in the contact hole for making electrical contact of the first layer interconnection with the semiconductor substrate.

The method for making the semiconductor device according to the present invention comprises the steps of forming an oxide film through selective chemical conversion of the first layer interconnection film which is more rigid than the first layer interconnection film on the region of the first layer interconnection film except the region on which the through hole for the second layer interconnection is to be formed, and forming hillocks concentratedly by heat processing at the region of the first layer interconnection film where the through hole for the second layer interconnection film is to be formed.

The rigid oxide film selectively formed on the first layer interconnection film suppresses the generation of hillocks at the regions except that region where the through hole for the second layer interconnection film is formed while it generates hillocks concentratedly on that region of the first layer interconnection film where the through hole is formed through heat processing. The height of the formed hillocks is controlled by the parameters such as the thickness of the rigid oxide film, formed area thereof and the condition of the heat processing to compensate for the step at that region of the first layer interconnection film where the through hole for the second layer interconnection is formed, thus minimizing the effective aspect ratio of the through hole for the second layer interconnection film.

These objects and other objects, features, aspects and advantages of the present invention will become more apparent from the following detailed description of the present invention when taken in conjunction with accompanying drawings.

DESCRIPTION OF PREFERRED EMBODIMENTS

FIGS. 2A to 2D are cross sectional views showing the steps of forming interconnection according to the manufacturing method of one embodiment of the present invention. The method for making the semiconductor device according to one embodiment of the present invention will be hereinafter described with reference to FIGS. 2A to 2D.

Figure 2A:
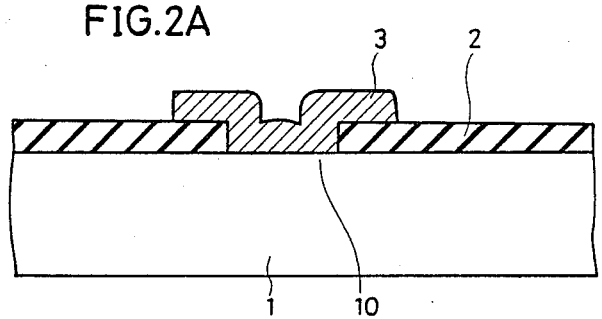
FIGS. 2A to 2D are cross sectional views showing the steps of forming interconnections in the process of manufacturing a semiconductor device having multilayered interconnection structure according to one embodiment of the present invention.

Referring to FIG. 2A, an insulating film 2 of e.g. PSG film having a contact hole reaching the surface of the substrate 1 in a predetermined region and the first layer aluminum interconnection film 3 are formed on the surface of the semiconductor substrate 1 of e.g. silicon using a conventional manufacturing method. Namely, an insulating film 2 is formed on the surface of the semiconductor substrate 1 by the CVD (chemical vapor deposition) method etc., and a patterned resist film (not shown) is formed on the insulating film 2. Then a contact hole 10 reaching the surface of the silicon substrate 1 is formed in the insulating film 2 by dry etching or wet etching using the patterned resist film as a mask. Then an aluminum film is formed by e.g. the sputtering method over the insulating film 2 and the contact hole 10, and thereafter the film is patterned into a predetermined shape to form the first layer aluminum interconnection film 3. On this occasion, a step is formed at the first layer aluminum interconnection film 3 in the region of the contact hole 10 under the influence of the step of the insulating film 2 at the contact hole 10.

Figure 2B:
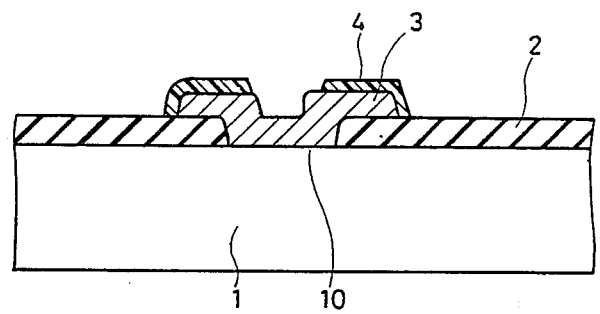

Let us turn to FIG. 2B. A resist film (not shown) patterned by using e.g. the photolithography is formed only on that region of the first layer interconnection film 3 where the through hole for the second layer interconnection is to be formed in the following steps. Chemical conversion processing, i.e. boiling process for several to 20 minutes in the heated D.I. water (deionized water) of more than 40° C in this embodiment, is performed on the first layer aluminum interconnection film 3 using the patterned resist film as a mask to form an alumina film 4, which is an oxide of aluminum, on a predetermined region of the first layer aluminum interconnection film 3.

Figure 2C:
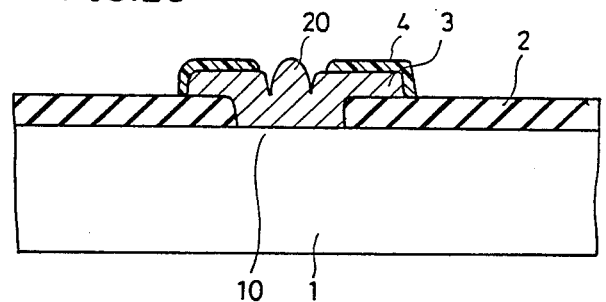

Referring to FIG. 2C, after removing the resist film used as a mask during the chemical conversion process, heat processing at 300° C to 500° C is performed for several ten minutes to one hour. Since the alumina film 4 is rigid enough to be effective in suppressing the generation of hillocks on the aluminum, hillocks 20 are generated concentratedly on the region where the alumina film 4 is not formed, that is, the region where the through hole for the second layer interconnection film is to be formed. The height of the hillock 20 can be suitably adjusted by suitably controlling the thickness of the alumina film 4, the area of the first layer aluminum interconnection film covered by the alumina film 4, the conditions of heat processing and so on. Therefore, the step formed at the region of the contact hole 10 of the first layer aluminum interconnection film 3 can be compensated.

Figure 1A:
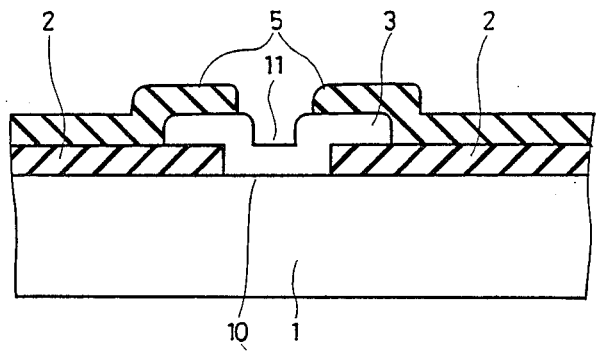
FIGS. 1A and 1B are cross sectional views showing the steps of forming interconnections in the process of manufacturing a semiconductor device having a conventional multilayered interconnection structure.
Figure 1B:
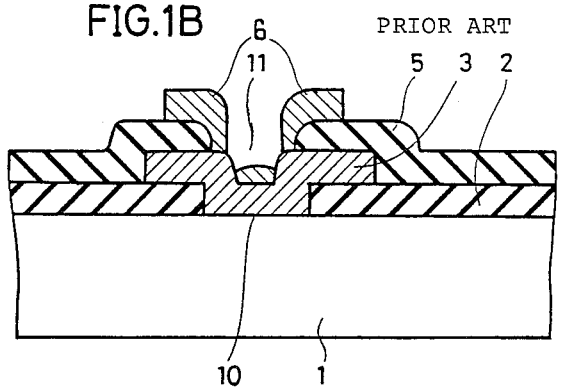
Figure 2D:
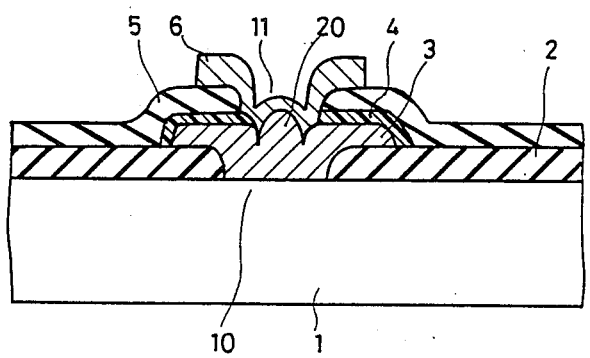

Referring to FIG. 2D, an interlayer insulating film 5 and the second layer aluminum interconnection film 6 are formed in a conventional manner. Namely, an insulating film 5 of e.g. silicon nitride film or silicon oxide film is formed by the CVD method etc., over the entire exposed surface, and then the film is patterned to form a through hole 11 for the second layer aluminum interconnection at a predetermined region on the contact hole 10. Then an aluminum film is formed by e.g. the sputtering method over the interlayer insulating film 5 and the through hole 11, and then, this aluminum film is patterned to form the second layer interconnection film 6. Different from the conventional semiconductor device shown in FIG. 1B, the effective aspect ratio of the through hole 11 for the second layer aluminum interconnection film 6 becomes small by virtue of the protruding hillocks formed in the region of the contact hole 10 of the first layer aluminum interconnection film 3. Consequently, the second layer aluminum interconnection film 6 can be formed in the region of the through hole 11 with good coverage. Thus a good electrical contact between the first layer aluminum interconnection film 3 and the second layer aluminum interconnection film 6 is provided and therefore an electrical contact of the first layer interconnection with the second layer interconnection can be readily and surely made even in such a structure that the through hole for the second layer interconnection is formed directly above the contact hole region of the first layer interconnection, realizing a semiconductor device having high degree of integration.

Although aluminum was used as the material for the first and second layer interconnection films in the above described embodiment, the material is not limited to that, an aluminum alloys such as aluminum silicide may be used to obtain the same effect. In addition, refractory metals can be used as the material of interconnections to obtain the same effect as described above, provided that the oxide film thereof formed by a suitable chemical conversion process is more rigid than the underlying refractory metal.

As described above, according to the present invention, hillocks are concentratedly formed in the contact hole portion for the first layer interconnection by a suitable chemical conversion process over the first layer interconnection to compensate for the step at the contact hole region of the first layer interconnection film, so that the effective aspect ratio of the through hole for the second layer interconnection becomes small and the electrical contact of the first layer interconnection with the second layer interconnection can be readily and surely made even in a semiconductor device having the contact hole for the first layer interconnection and the through hole for the second layer interconnection formed in the same region, and thus a semiconductor device having high degree of integration can be implemented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor substrate;
   a first insulating film formed on a surface of said semiconductor substrate and having, in a predetermined region thereof, a first penetrating hole reaching the surface of said semiconductor substrate;
   a first interconnection film formed on a predetermined region of said first insulating film and electrically connected to the surface of said semiconductor substrate via said first penetrating hole;
   an encapsulation layer, comprising an oxide of said first interconnection film, formed on said first interconnection layer and on said first insulation film, said encapsulation layer having a void therethrough overlapping said first penetrating hole;
   a second insulating film formed on said encapsulation layer and said first insulating film and having in that region which overlaps with said first penetrating hole in planar layout a second penetrating hole reaching the surface of said first interconnection film; and
   a second interconnection film formed on a predetermined region of said second insulating film and electrically connected to said first interconnection film via said second penetrating hole, wherein
   said first interconnection film has a hillock selectively formed at said first penetrating hole portion and having a predetermined height.

2. A semiconductor device according to claim 1, wherein said hillock is formed by subjecting said first interconnection film to a boiling process and to a heat process to cause said interconnection film to form said hillock.

3. A semiconductor device according to claim 2, wherein said boiling process is carried out in deionized water.

4. A semiconductor device according to claim 1, wherein said first interconnection film is an aluminum film or an aluminum alloy film.

* * * * *